United States Patent
Aimone

(10) Patent No.: US 9,456,522 B2
(45) Date of Patent: Sep. 27, 2016

(54) SELF-DETERMINATION OF EQUIPMENT RACK CONSUMPTION BY RACK-MOUNTED APPLIANCES

(71) Applicant: Oracle International Corporation, Redwood City, CA (US)

(72) Inventor: Jon K. Aimone, Tracy, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 14/266,469

(22) Filed: Apr. 30, 2014

(65) Prior Publication Data

US 2015/0319879 A1  Nov. 5, 2015

(51) Int. Cl.
*G06F 17/00* (2006.01)
*H05K 7/14* (2006.01)
*G06Q 10/08* (2012.01)

(52) U.S. Cl.
CPC .......... *H05K 7/1498* (2013.01); *G06Q 10/087* (2013.01)

(58) Field of Classification Search
CPC .......... G06F 17/00; G06F 19/00; G06F 7/00; G06Q 30/00; G06Q 90/00; G06K 13/00
USPC ................. 235/375, 487, 385, 440
See application file for complete search history.

(56) References Cited

U.S. PATENT DOCUMENTS

| | | | | |
|---|---|---|---|---|
| 2006/0278527 A1* | 12/2006 | Kuhn | ............... | G01N 27/404 204/431 |
| 2006/0283944 A1* | 12/2006 | Holley | ............... | A01N 1/02 235/385 |
| 2009/0189767 A1* | 7/2009 | Primm | ............... | G06K 7/0008 340/572.1 |
| 2009/0195363 A1* | 8/2009 | Downie | ............... | G06K 5/02 340/10.4 |
| 2009/0205416 A1* | 8/2009 | Campbell | ............... | G01F 1/34 73/202.5 |
| 2009/0207022 A1* | 8/2009 | Reckeweg | ............... | G06K 7/0008 340/572.1 |
| 2011/0248823 A1* | 10/2011 | Silberbauer et al. | ........ | 340/10.1 |
| 2012/0005344 A1* | 1/2012 | Kolin | ............... | H05K 7/20836 709/226 |
| 2013/0241699 A1* | 9/2013 | Covaro | ............... | G06Q 10/0875 340/10.1 |
| 2014/0091138 A1* | 4/2014 | Nordin | ............... | G06K 7/0008 235/375 |
| 2014/0292582 A1* | 10/2014 | Ware | ............... | G01S 5/04 342/450 |
| 2014/0313016 A1* | 10/2014 | Nizam | ............... | G06K 17/0022 340/10.5 |
| 2014/0361077 A1* | 12/2014 | Davidson | ............... | 235/385 |
| 2015/0069119 A1* | 3/2015 | Hastman | ............... | 235/385 |

\* cited by examiner

*Primary Examiner* — Edwyn Labaze
(74) *Attorney, Agent, or Firm* — Marsh Fischmann & Breyfogle LLP; Daniel J. Sherwinter

(57) ABSTRACT

Embodiments include systems and methods for self-determination of equipment rack consumption by rack-mounted appliances. Some embodiments operate in context of pre-integrated systems having a number of rack-mounted appliances installed in an equipment rack. The equipment rack can include a number of passive location designators, each positioned on the equipment rack in a physical location corresponding to a mounting location for a rack-mounted appliance, and each including a code that indicates its associated mounting location. Each rack-mounted appliance can include a sensor which, when the rack-mounted appliance is installed in a mounting location of the equipment rack, can read the code on the passive location designator associated with that mounting location. This reading can be used by the rack-mounted appliance to self-determine its rack consumption.

22 Claims, 5 Drawing Sheets

SELF-DETERMINATION OF EQUIPMENT RACK CONSUMPTION BY RACK-MOUNTED APPLIANCES

FIELD

Embodiments relate generally to rack-mounted systems, and, more particularly, to self-determination of equipment rack consumption by rack-mounted appliances.

BACKGROUND

Many large computational systems are implemented as a number of rack-mounted appliances installed in an equipment rack. For example, the rack-mounted appliances can include computer servers, power supplies, storage libraries, and/or other computational devices. Some such systems are sold as pre-integrated, or "engineered," systems, which can provide customers with an effectively pre-fabricated equipment rack. The pre-integrated rack can be filled, or partially filled, with rack-mounted appliances of particular types designed to perform certain functions, meet certain specifications, etc. The pre-integration can reduce the cost and complexity of information technology infrastructures, while increasing productivity and performance.

Pre-integrated systems are often configured at a fabrication facility (e.g., a factory), and are reconfigured, when deployed to a customer facility, to integrate with the customer's computational environment. Each configuration (e.g., and with any subsequent reconfigurations, such as when appliances are added, removed, moved, etc.), traditionally involves a human operator entering data into a host system or the like to indicate which appliances are installed, physical locators for the appliances (e.g., where each appliance is installed in the equipment rack), logical locators for the appliances (e.g., an Internet Protocol (IP) address and host name for each appliance), etc. Human configuration of the pre-integrated systems can be time-consuming, error-prone, and/or otherwise undesirable.

BRIEF SUMMARY

Among other things, embodiments provide novel systems and methods for self-determination of equipment rack consumption by rack-mounted appliances. Some embodiments operate in context of pre-integrated systems having a number of rack-mounted appliances installed in an equipment rack. The equipment rack can include a number of passive location designators, each positioned on the equipment rack in a physical location corresponding to a mounting location for a rack-mounted appliance, and each including a code that indicates its associated mounting location. Each rack-mounted appliance includes a sensor (e.g., an optical sensor) which, when the rack-mounted appliance is installed in a mounting location of the equipment rack, can read the code on the passive location designator associated with that mounting location. This reading can be used by the rack-mounted appliance to self-determine its rack consumption (e.g., its mounting location and/or the amount of space it consumes in the rack). In some implementations, the self-determined rack consumption can be used to determine if the rack-mounted appliance is installed correctly. In other implementations, the self-determined rack consumption can be used to map the physical location to logical locators associated with the appliance (e.g., an IP address and host name). For example, such mappings can facilitate auto-configuration of a pre-integrated system by a host system.

According to one set of embodiments, a system is provided for self-determination of rack consumption by rack-mounted appliances. The system includes: an equipment rack having a number of rails configured to at least partially support each of a number of rack-mounted appliances at a respective one of a number of mounting locations, each rail comprising a passive location designator that corresponds to a respective one of the mounting locations, and each rack-mounted appliance comprising a sensor that operates to read at least one of the passive location designators thereby indicating to the rack-mounted appliance its rack consumption according to the reading when the rack-mounted appliance is mounted in the equipment rack.

According to another set of embodiments, another system is provided for self-determination of rack consumption by rack-mounted appliances. The system includes: a rack-mounted appliance having: a sensor that operates, when the rack-mounted appliance is installed at a particular one of a number of mounting locations of an equipment rack, to read at least one of a number of passive location designators to determine the particular mounting location, each passive location designator comprised by the equipment rack and corresponding to a respective one of the mounting locations; and a processor that operates to receive an indication of the particular mounting location from the sensor and to determine a rack consumption of the rack-mounted appliance according to the indication.

According to another set of embodiments, a method is provided for self-determination of rack consumption by rack-mounted appliances. The method includes: reading a code from a particular one of a number of passive location designators using a sensor not in contact with the passive location designator, the particular passive location designator being one of a number of passive location designators, each disposed on an equipment rack and each corresponding to a respective one of a number of mounting locations of the equipment rack, the sensor being coupled with a rack-mounted appliance installed at a particular one of the mounting locations, and the particular passive location designator corresponding to the particular mounting location; and determining, by the rack-mounted appliance, a rack consumption of the rack-mounted appliance according to the code. Some such embodiments further include: determining a physical locator associated with the rack-mounted appliance according to the determined rack consumption of the rack-mounted appliance; mapping a logical locator associated with the rack-mounted appliance to the physical locator; and storing the mapping for use by a host computational system.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
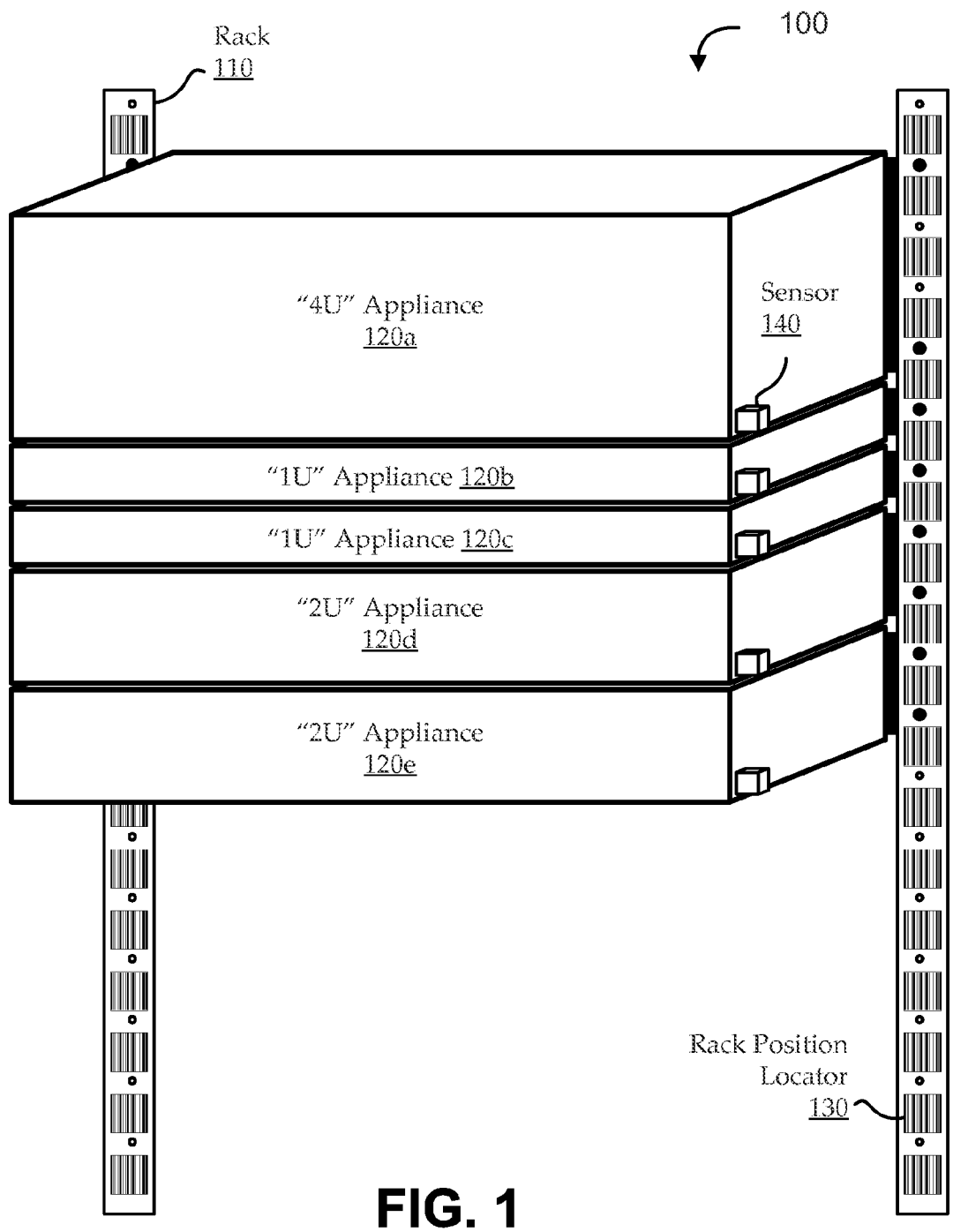
FIG. 1 shows a rack-mounted system for use with various embodiments.

Turning first to FIG. 1, a rack-mounted system 100 is shown for use with various embodiments. The rack-mounted system 100 includes a number of rack-mounted appliances 120 installed in an equipment rack 110. Some implementations of the rack-mounted system 100 can be pre-integrated (e.g., a so-called "engineered") systems. For example, one such system can be a large-capacity, pre-integrated database system having database servers, storage servers, network switches, cache devices, etc. While only two rails of the equipment rack 110 are shown to avoid over-complicating the figure, the equipment rack 110 can have any suitable structure for supporting multiple rack-mounted appliances 120. For example, a typical equipment rack 110 can include at least four vertical rails, top and bottom plates, crossbeams, and/or other structural elements.

As illustrated, rack-mounted appliances 120 can have different sizes. Some implementations of rack-mounted appliances 120 are designed to consume an integer number of standard rack units ("U"). For example, some standard equipment racks 110 are 19 or 23 inches wide and are designed to fit some number of 1.75-inch rack units (e.g., a 42U rack can accommodate approximately six vertical feet of appliances). For the sake of illustration, the illustrated rack-mounted system 100 includes 1U, 2U, and 4U rack-mounted appliances 120. Embodiments described herein can operate in context of any size of equipment rack 110, regardless of vertical or horizontal dimensions, RU sizing, appliance spacing, etc. Further, embodiments can operate in context of partially filled equipment racks 110, for example, where only a quarter of a standard 42RU rack is filled with rack-mounted appliances 120.

Pre-integrated systems are often configured at a fabrication facility, and are reconfigured, when deployed to a customer facility, to integrate with the customer's computational environment. Each configuration (e.g., and any subsequent reconfigurations, such as when appliances are added, removed, moved, etc.) traditionally involves a human operator entering data into a host system or the like to indicate which appliances are installed, physical locators for the appliances, logical locators for the appliances, etc. For example, each rack-mounted appliance 120 can have one or multiple associated Internet Protocol (IP) addresses and host names (e.g., for remote access control, for corresponding Internet and/or other network connections, etc.), and it can be desirable to associate each of those logical locators with a physical location of the corresponding appliance (e.g., to support maintenance, troubleshooting, etc.). Traditionally, to find physical locators of the rack-mounted appliances 120, a human operator can examine the rack-mounted system 100 to determine a physical location of each rack-mounted appliance 120 (e.g., by counting the number of rack units, mounting hole locations, inches, etc. from the top or bottom of the rack) and can manually enter the information into a computational system (e.g., in association with corresponding logical locators). Manual configuration of the pre-integrated systems can tend to be time-consuming, error-prone, and/or otherwise undesirable.

Some other approaches have been implemented in limited contexts. For example, some equipment racks are designed to include active and/or unique couplings with appliances, such that each mounting location includes a unique mechanical key, unique electrical port (e.g., a port with a pre-assigned logical address), unique cabling, etc. Such approaches can often add appreciable cost and complexity to the equipment rack, and can still often involve error-prone manual intervention (e.g., plugging the correct cable into the correct appliance in a particular mounting location).

As described herein, embodiments provide novel systems and methods for self-determination of equipment rack 110 consumption by rack-mounted appliances 120, which can facilitate automatic configuration of the rack-mounted system 100. The equipment rack 110 can include a number of passive location designators 130, each positioned on the equipment rack 110 in a physical location corresponding to a mounting location for a rack-mounted appliance, and each including a code that indicates its associated mounting location. The rack-mounted appliances 120 can include one or more sensors 140 for reading the codes from the passive location designators 130 to determine rack consumptions for their respective rack-mounted appliances 120. As used herein, "rack consumption" is intended to generally include desired information about the physical location of a rack-mounted appliance 120 on an equipment rack 110 and/or an amount of the rack space (e.g., the number of rack units of rail real estate) that is consumed by its appliance. The self-determination of rack-consumption can be used to facilitate various functions, including auto-configuration of a rack-mounted system 100, auto-identification of improperly installed rack-mounted appliances 120, etc.

Possible mounting locations on an equipment rack 110 can be determined in any suitable manner. For example, an equipment rack 110 can be designed to accommodate mounting of a rack-mounted appliance 120 at floating locations (e.g., using specially designed clips or other hardware), at any of a number of locations defined by integrated mounting features (e.g., at any hole in the rails designed to accommodate mounting hardware of the appliance), at any of a number of locations defined by standard appliance sizing (e.g., in one-rack-unit increments of distance), etc. Accordingly, a corresponding passive location designator 130 can be positioned to correspond to some or all of the suitable mounting locations of the equipment rack 110. For example, passive location designators 130 can be positioned on only one or multiple rails of the equipment rack 110, or in any other suitable manner. In the illustrated embodiment, a passive location designator 130 is positioned directly below each mounting hole, and mounting holes are separated by a one-rack-unit spacing. Standard equipment racks 110 often have multiple mounting holes and/or other features in each rack unit of vertical space on each rail.

The passive location designators 130 can be positioned on the equipment rack 110 in any suitable manner. In some implementations, the passive location designators 130 are integrated into the rails of the equipment rack 110, for example, as part of the manufacturing of the rails (e.g., by stamping or otherwise forming the passive location designators 130 into the rails, painting or otherwise applying the passive location designators 130 onto the rails, etc.). In other implementations, the passive location designators 130 are attached to the rails of the equipment rack 110 after the rails are manufactured. For example, the passive location designators 130 can be applied to the rails as an additive feature (e.g., an applied sticker, label, or the like; painted on, drawn on, or the like), as a subtractive feature (e.g., a cutout, etching, or the like), etc. In certain implementations, the passive location designators 130 can be retrofit to an existing equipment rack 110 (e.g., a previously deployed rack-mounted system 100).

Each passive location designator 130 includes a code that indicates its associated mounting location. The codes can include machine-readable information (i.e., information that can be decoded by a computational system) and/or human readable information (i.e., information that can be read by a human without an intermediate computational system). Some implementations include an optical code. For example, the optical code can include a two-dimensional code (e.g., a label having a barcode, a Quick Response (QR) code, printed text, symbols, etc.), a three-dimensional code (e.g., an embossed label, a holographic label, a notch, a cutout, an etching, etc.), or any other code that can be sufficiently unique to indicate its associated mounting location. Other implementations include a magnetic code. For example, the code can include magnetic characters (e.g., letters, symbols, or other characters printed using magnetic ink) or any other suitable manner for manifesting a magnetic signature that can be sufficiently unique to indicate its associated mounting location. Other implementations include a passive, electrical code. For example, the electrical code can be implemented as a passive radiofrequency identification (RFID) tag, or the like, that can manifest an electrical (e.g., electromagnetic) signature that can be sufficiently unique to indicate its associated mounting location. Embodiments of the passive location designators 130 are designed to be read without contact.

Each rack-mounted appliance 120 can include a sensor 140 which, when the rack-mounted appliance 120 is installed in a mounting location of the equipment rack 110, can read the code on the passive location designator 130 associated with that mounting location. As described above, the codes on the passive location designators 130 can include optical codes, magnetic codes, electrical codes, and/or any other suitable types of codes. Accordingly, various embodiments include sensors 140 adapted to read one or more of those types of codes. For example, some embodiments include one or more optical sensors (e.g., light-sensitive electronics, charge-coupled devices (CCDs), cameras, etc.), electromagnetic sensors (e.g., magnetic read heads, magnetic ink readers, magnetic field detectors, antennas, near-field radiofrequency receivers, etc.), and/or any other suitable types of sensors for reading the codes sufficiently to discern an indication of its associated mounting location.

While embodiments are described in context of equipment racks 110 having multiple, adjacent rack-mounted appliances 120, similar techniques can be applied in other contexts. For example, some implementations include sparsely populated equipment racks 110, which can have one or more empty slots, adjacent and/or non-adjacent rack-mounted appliances 120, etc.

Figure 2:
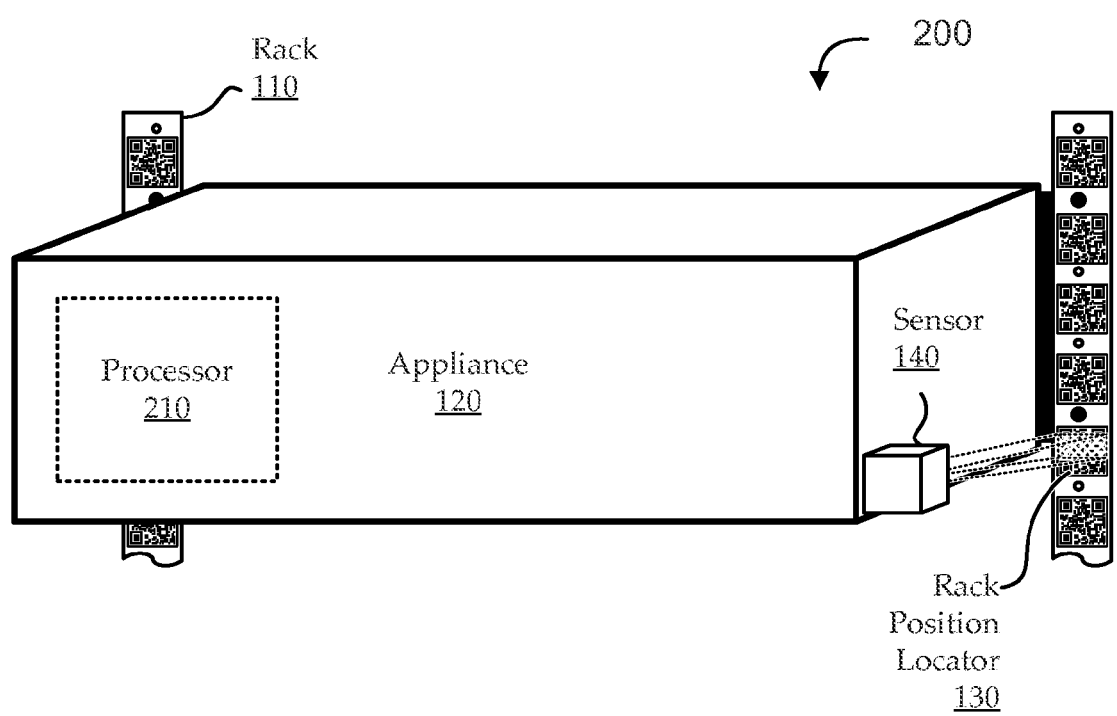
FIG. 2 shows a portion of an illustrative rack-mounted system having only one rack-mounted appliance, to focus on certain functionality of some embodiments.

FIG. 2 shows a portion of an illustrative rack-mounted system 200 having only one rack-mounted appliance 120, to focus on certain functionality of some embodiments. In the illustrative rack-mounted system 200, a mounting hole is provided at single-rack-unit spacings on each rail of an equipment rack 110, and a passive location designator 130 is positioned in relation to each mounting hole (i.e., each mounting location in this implementation). Each passive location designator 130 includes a Quick Response (QR) code that uniquely indicates its respective mounting location (e.g., or sufficiently uniquely, where other contextual information can be used in conjunction with the code to provide a unique identification).

In the illustrated embodiment, the rack-mounted appliance 120 is a "4U" appliance with a single sensor 140. The sensor 140 is positioned toward the lower-rear portion of one side of the chassis to point at the passive location designator 130 corresponding to the lowest mounting hole being used by the rack-mounted appliance 120. The sensor 140 can be an optical sensor (e.g., an optical scanner, CCD, camera, etc.) that operates to read the QR code from the passive location designator 130.

Some implementations include one or more processors 210. For example, the processors 210 can be part of and/or in communication with the sensors 140. Embodiments of the processors 210 can direct the sensors 140 to read the codes from the passive location designators 130 and can interpret the readings of the sensors to make various determinations. For example, the processors 210 can decode the sensor 140 data to determine a mounting location of the associated rack-mounted appliance 120 on the equipment rack 110. In some implementations, the processors 210 include (or are in communication with one or more data stores that include) additional information about one or more of the rack-mounted appliances 120. For example, each rack-mounted appliance 120 can include a processor 210 that directs operation of its sensor 140 (or multiple sensors) and knows information about itself, such as the number of rack units of vertical space it consumes, logical locator information, etc. The processor can use that information to determine the rack consumption of the rack-mounted appliance 120.

For example, as illustrated, the rack-mounted appliance 120 can include a sensor 140 that reads a code on a passive location designator 130 indicating that the rack-mounted appliance 120 is installed at location "5" of an equipment rack 110 (e.g., at a fifth mounting hole, five rack units from the top of the equipment rack 110, etc.). The processor can have access to information indicating that the rack-mounted appliance 120 is four rack-units tall, and can derive from that information that the rack-mounted appliance 120 is consuming 4U of equipment rack 110 space that include location "5" (e.g., locations "2"-"5"; or, alternatively, locations "5"-"8", locations "3"-"6", etc.). As described below, one or more sensors 140 on the rack-mounted appliance 120 can be similarly used to determine and/or audit rack consumption of rack-mounted appliances 120, to determine if rack-mounted appliances 120 are installed correctly (e.g., if they are mounted in an incorrect location, crookedly, etc.), if rack-mounted appliances 120 are installed in an appropriate equipment rack 110 (e.g., where multiple racks each have unique passive location designators 130 and/or some other rack-level designation), etc.

Figure 3A:
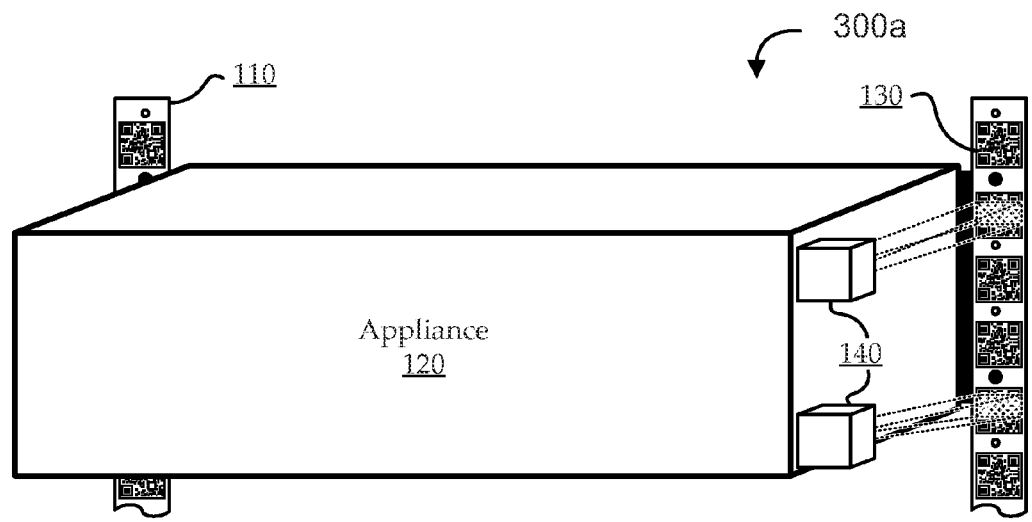
FIGS. 3A-3C show three illustrative configurations of sensors and passive location designators, according to various embodiments.
Figure 3B:
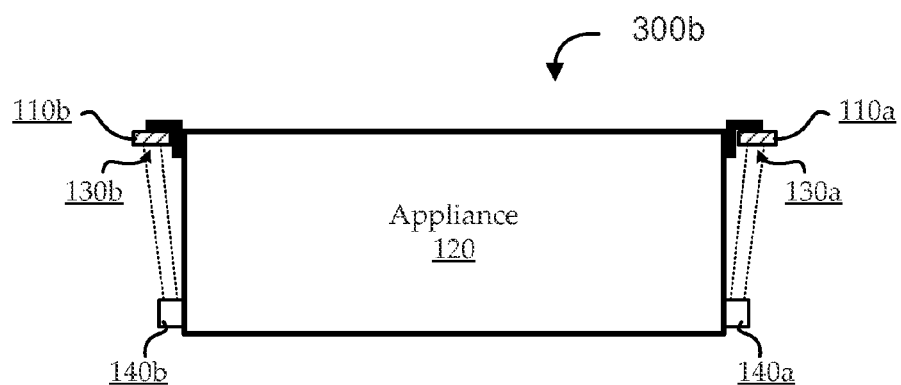
Figure 3C:
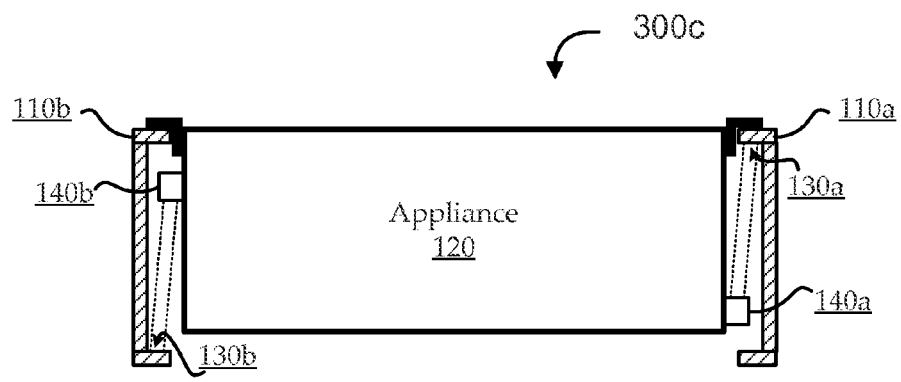

FIGS. 3A-3C show three illustrative configurations of sensors 140 and passive location designators 130, according to various embodiments. Turning first to FIG. 3A, a portion of an illustrative rack-mounted system 300a is shown having a rack-mounted appliance 120 that includes two sensors 140.

The sensors 140 are positioned toward the upper-rear and lower-rear portions of one side of the chassis to point at the passive location designator 130 corresponding to the highest and lowest mounting hole being used by the rack-mounted appliance 120, respectively. The sensors 140 are illustrated as optical sensors configured to read the QR codes from respective passive location designators 130. Providing multiple sensors 140 in this manner can facilitate various functionality. For example, the multiple sensors 140 can be used to determine the rack consumption (e.g., the number of rack units of space being consumed by the appliance) without using additional stored information, can be used to detect if the appliance is installed at an undesirable angle, can be used to determine rack consumption where fewer than all of the mounting locations include passive location designators 130 (e.g., where only one of the sensors 140 will "see" a passive location designator 130, but it could be at either position depending on the rack configuration), etc.

Turning to FIG. 3B, a portion of another illustrative rack-mounted system 300b is shown having a rack-mounted appliance 120 that includes two sensors 140 on opposite sides of the appliance chassis. The sensors 140 are positioned toward the rear portion of each side of the chassis to point at passive location designators 130 on their respective sides of the appliance corresponding to a particular mounting hole associated with the mounting location of the appliance (e.g., the highest mounting hole on both sides, the lowest mounting hole on both sides, the highest mounting hole on one side and the lowest mounting mole on the other side, etc.). In FIG. 3C, a portion of another illustrative rack-mounted system 300c is shown having a rack-mounted appliance 120 that includes two sensors 140 on opposite sides of the appliance chassis pointing in opposite directions. One sensor 140a is positioned toward the rear portion of one side of the chassis and points at a passive location designator 130a located on a front rail of the equipment rack 110; and the other sensor 140b is positioned toward the rear portion of an opposite side of the chassis and points at a passive location designator 130b located on a rear rail of the equipment rack 110. As described above, providing multiple sensors 140 in any of these and/or other manners can facilitate various functionality, such as determining the rack consumption, providing redundancy and/or sources of verification, detecting appliance alignment or installation issues, determining rack consumption robustly in various equipment rack 110 environments that may position passive location designators 130 in different ways, etc. While the embodiments illustrated in FIGS. 3A-3C each include two sensors 140, each illustrated sensor 140 can include one or more sensors 140, and/or any suitable number of sensors 140 can be included to provide desired functionality.

Figure 4:
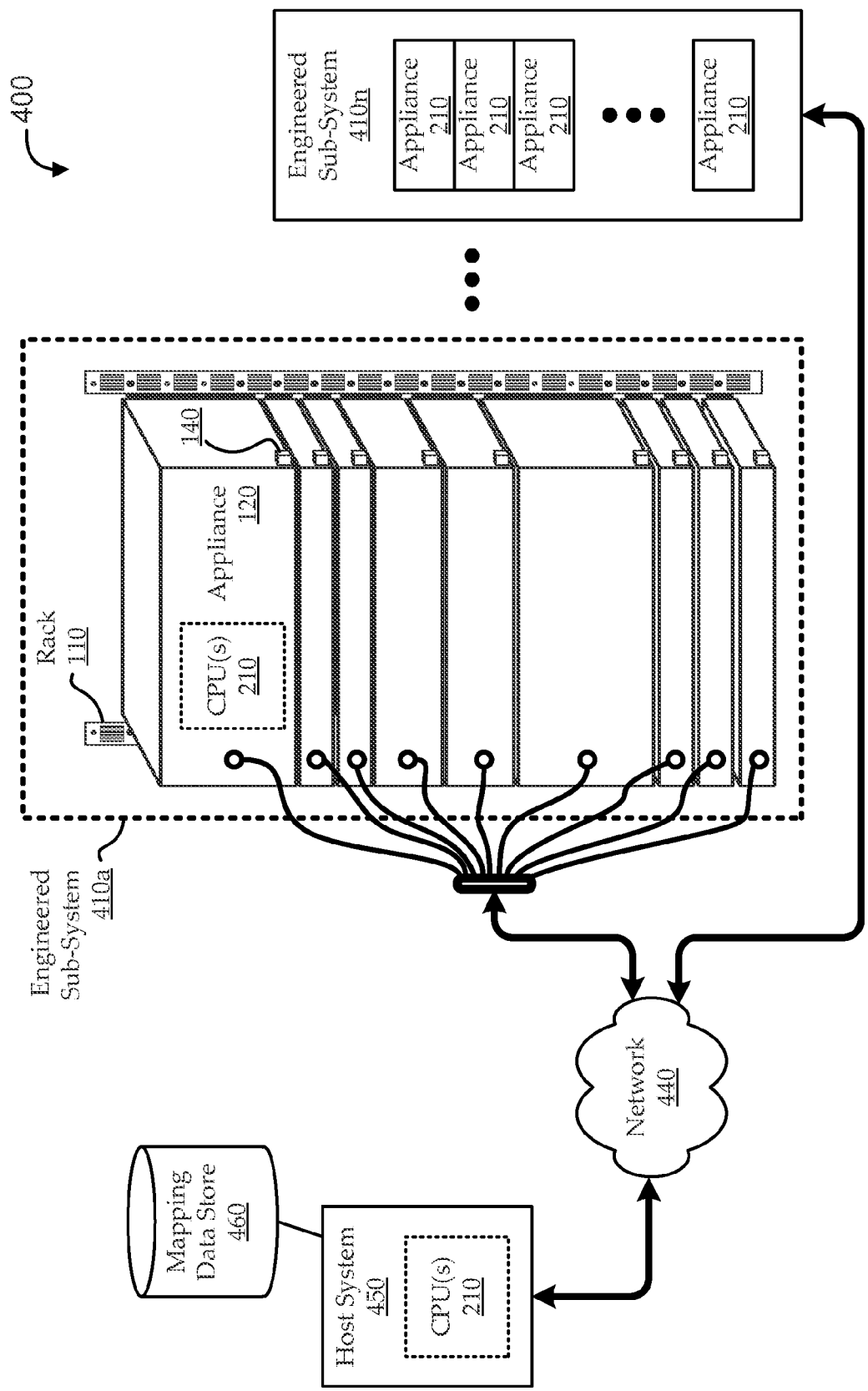
FIG. 4 shows an illustrative rack-mounted system having a number of rack-mounted subsystems in communication with a host system over a network, according to various embodiments.

In some embodiments, rack-mounted systems include and/or are in communication with one or more other rack-mounted subsystems, host systems, etc. FIG. 4 shows an illustrative rack-mounted system 400 having a number of rack-mounted subsystems 410 (e.g., engineered "pre-integrated" subsystems) in communication with a host system 450 over a network 440, according to various embodiments. The host system 450 can include one or more host computers in one or more locations. In one implementation, the host system 450 is implemented as a rack-mounted appliance 120 installed on an equipment rack 110, for example, along with other rack-mounted appliances 120 of one or more rack-mounted subsystems 410. In another implementation, the host system 450 is implemented as one or more host computers located remotely from the rack-mounted subsystems 410 and having remote access over the network 440 to some or all of the rack-mounted subsystems 410. The network 440 can include any suitable network, including, for example, public and/or private networks, secure or unsecured networks, wired and/or wireless networks, local area networks, wide area networks, storage area networks, Internet Protocol networks, etc. Further, the rack-mounted subsystems 410 can communicate with the host system 450 in any suitable manner, including, for example, using point-to-point addressing, mesh networking, routers and/or switches, multicast or broadcast protocols, etc.

In such systems, it can be desirable for the host system 450 to be able to communicate with the various rack-mounted subsystems 410 and their component rack-mounted appliances 120. Suppose, if the rack-mounted subsystems 410 are used to implement a large data storage system, is can be desirable to use the host system 450 to access and/or manipulate data stored in the storage system. Similarly, it can be desirable to have logical access to functions of particular rack-mounted appliances 120 at particular physical locations in one or more of the rack-mounted subsystems 410, to be able to determine physical locations of rack-mounted appliances 120 for troubleshooting or maintenance purposes, etc. Some embodiments provide these and/or other functions by mapping physical rack consumption information to logical information for respective rack-mounted appliances 120.

Some implementations include one or more processors 210. The processors 210 (indicated generally as "CPUs" in FIG. 4, but understood to generally include any suitable type of processor) can be implemented in the rack-mounted appliances 120 (e.g., in each appliance or in some appliances configured to act as "master" appliances to other "slave" appliances, etc.), in other locations (e.g., a dedicated controller module) of the rack-mounted subsystems 410, in the host system 450, and/or in any other suitable location or locations. As described above, embodiments can use sensors 140 and passive location designators 130 to self-determine physical rack consumption information (e.g., one or more "physical locators"). In some embodiments, the processors 210 can generate and/or maintain logical mappings between self-determined physical rack consumption information and logical locators, such as appliance IP address(es), host name(s), etc.

In one illustrative implementation, each mounting location in each equipment rack 110 is pre-associated with a particular set of logical locators. The logical locators can include any suitable logical locators, depending, for example, on the logical environment in which the rack-mounted appliance 120 is intended to operate (e.g., the type of network architecture, supported protocols, etc.). For the sake of illustration, the rack-mounted system 400 can be implemented as an IP network, and the host system 450 can perform addressable communications using sets of network locators, such as IP address and host name combinations. When the rack-mounted system 400 is deployed or modified, the host system 450 can auto configured the rack-mounted system 400. For example, the host system 450 can communicate the pre-associated logical locator information for the various mounting locations to the rack-mounted appliances 120. Each rack-mounted appliance 120 (e.g., on its own as part of an initialization sequence, as instructed by the host system 450, or in any other suitable manner) can determine its own rack consumption by using its one or more sensors 140 to read one or more codes from one or more passive location designators 130. The rack-mounted appliances 120 can then assign themselves an appropriate set of logical locators (e.g., a host name and IP address) according to its rack consumption and the received pre-associated logical locator information. The rack-mounted appliances 120 can store the logical assignments, communicate the logical assignments to the host system 450, etc. In some implementations, mappings are generated between the physical and logical locators. For example, the mappings can be generated and/or maintained by the rack-mounted appliances 120, by the host system 450, and/or as otherwise appropriate. In one implementation, the mappings are stored in a mapping data store 460 that is part of or in communication with the host system 450.

In another illustrative implementation, each rack-mounted appliance 120 has a unique logical identifier (e.g., a media access control (MAC) address) that is static to the appliance (not dynamic to the network 440). When connected to the network 440, the rack-mounted appliances 120 use a protocol (e.g., Dynamic Host Configuration Protocol (DHCP)) to communicate their presence on the network 440 to the host system 450 (e.g., acting as a DHCP server) and to request a logical locator assignment (e.g., assignment of an IP address). In some implementations, the communication to the host computer 450 includes a self-determined rack consumption, which the host system 450 can use to determine an appropriate logical assignment (e.g., where the mounting locations are pre-associated with logical locator information, as described above) and/or to generate and store a mapping between the logical and physical locators (e.g., in the mapping data store 460).

In yet another illustrative implementation, each rack-mounted appliance 120 is pre-associated with a unique set of logical locators (e.g., its own host name and IP address). When connected to the network 440, the rack-mounted appliances 120 can self-determine their physical locator information (by self-determining rack consumption via sensors 140 and passive location designators 130). The rack-mounted appliance 120 can then generate a mapping between the physical and logical locators and/or communicate the mapping to the host system 450; or communicate the physical and logical locators to the host system 450 so that the host system 450 can generate and/or store the mappings (e.g., in the mapping data store 460).

These and/or other techniques can allow the rack-mounted appliances 120, the rack-mounted subsystems 410, and/or the host system 450 to automatically determine the physical and logical configuration of the rack-mounted system 400. This can facilitate various functions. For example, such techniques can facilitate the host system 450 auto-configuring some or all of a pre-integrated system when it is deployed, when changes are made (e.g., when an appliance is changes, upgraded, removed, added, etc.). Similar techniques can be used to audit the rack-mounted system 400 to determine if any configurations have changed or are not as expected. Further, as described above, mapping of the logical and physical information can facilitate additional functionality. According to one example, if a particular rack-mounted appliance 120 in a room full of large numbers of such appliances is not operating properly, the mappings can be used to direct maintenance personnel to an appropriate physical location. According to another example, if a rack-mounted appliance 120 self-determines that it is installed improperly, the host system 450 can use stored mappings to logically instruct the appliance to provide an indication, such as a visual and/or audible alert (e.g., in other implementations, the appliance can instruct itself to provide the indication).

It will be appreciated that the rack-mounted systems shown in FIGS. 1-4 illustrate only some of many implementations of such systems for providing the functionality described herein. For example, other implementations can provide different numbers, shapes, arrangements, configurations, etc. of rack-mounted appliances 120, equipment racks 110, rack-mounted subsystems 410, host systems 450, networks 440, sensors 140, passive location designators 130, etc. Further, the embodiments described above and/or other embodiments can be used to provide various types of functionality, including functionality of the methods described below. The method embodiments described below can also be performed using system embodiments other than those described above.

Figure 5:
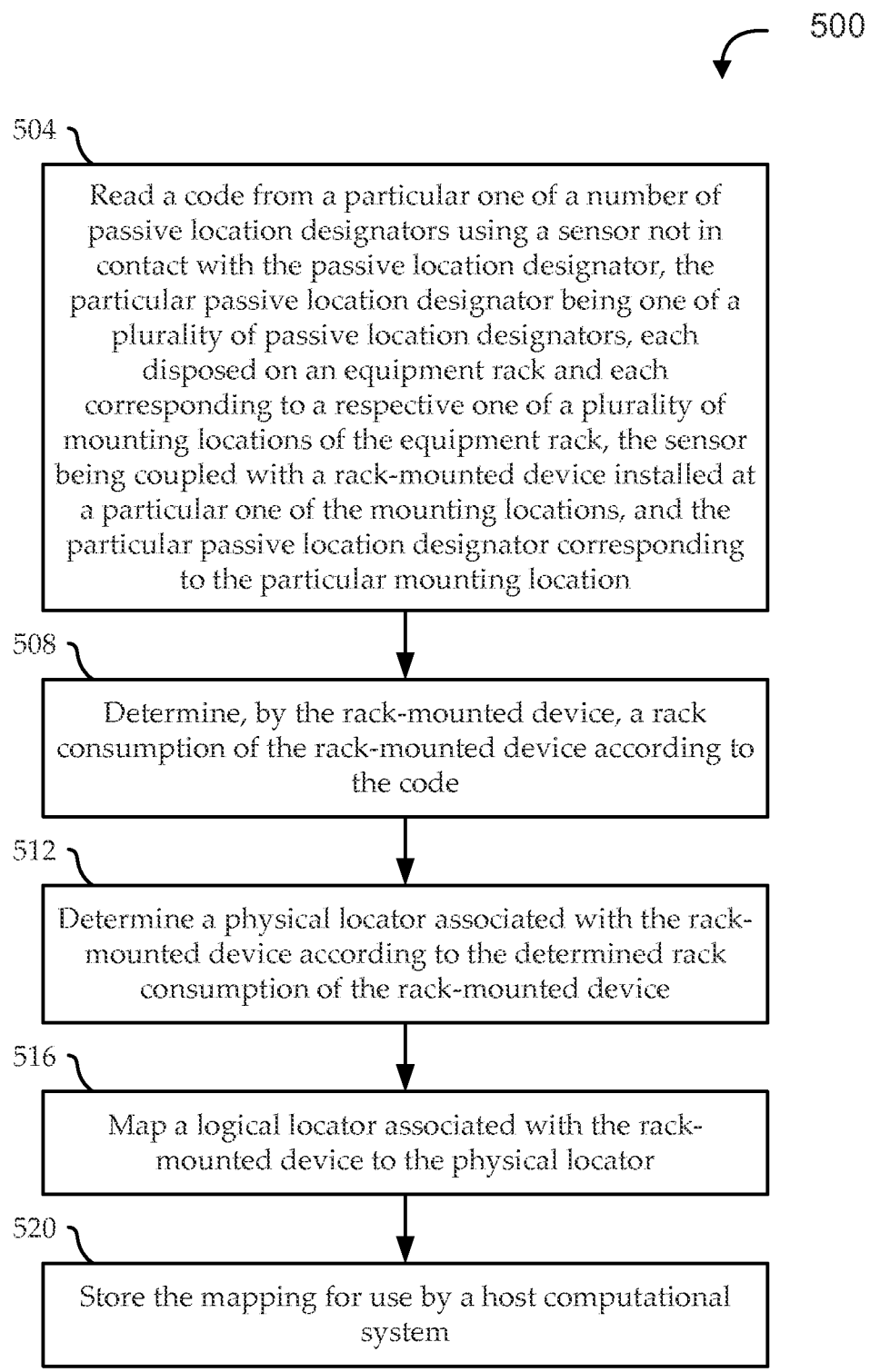
FIG. 5 shows a flow diagram of an illustrative method for self-determination of rack consumption by rack-mounted appliances, according to various embodiments.

FIG. 5 shows a flow diagram of an illustrative method 500 for self-determination of rack consumption by rack-mounted appliances, according to various embodiments. Embodiments of the method 500 begin at stage 504 by reading a code from a particular one of a number of passive location designators using a sensor not in contact with the passive location designator. The particular passive location designator can be one of a plurality of passive location designators, each disposed on an equipment rack and each corresponding to a respective mounting location of the equipment rack. The sensor can be coupled with a rack-mounted appliance installed at a particular one of the mounting locations, and the particular passive location designator can correspond to the particular mounting location.

At stage 508, the rack-mounted appliance can determine a rack consumption of the rack-mounted appliance according to the code. For example, the rack consumption can indicate one or more mounting locations, an amount of rack space used by the appliance (e.g., a number of rack units), etc. Accordingly, the rack-mounted appliance can self-determine its rack consumption.

In some embodiments, at stage 512, a physical locator associated with the rack-mounted appliance can be determined according to the determined rack consumption of the rack-mounted appliance. For example, the physical locator can be the rack consumption, part of the rack consumption information, and/or derived from the rack consumption information. At stage 516, a logical locator associated with the rack-mounted appliance can be mapped to the physical locator. For example, the logical locator can be any suitable set of one or more logical designations for the appliance on a network, such as a host name, IP address, etc. In certain implementations, at stage 520, the mapping can be stored for use by a host computational system. For example, the mappings can be stored by the appliances, the host system, and/or in any other suitable manner.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The various operations of methods and functions of certain system components described above may be performed by any suitable means capable of performing the corresponding functions. The means may include various hardware and/or software component(s) and/or module(s), including, but not limited to a circuit, an application specific integrated circuit (ASIC), or processor. For example, logical blocks, modules, and circuits described may be implemented or performed with a general purpose processor, a digital signal processor (DSP), an ASIC, a field programmable gate array signal (FPGA), or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A system for self-determination of rack consumption by rack-mounted appliances, the system comprising:
    an equipment rack having a plurality of rails configured to at least partially support each of a plurality of rack-mounted appliances at a respective one of a plurality of mounting locations,
    each rail comprising a passive location designator that corresponds to a respective one of the mounting locations, and
    each rack-mounted appliance comprising:
        a sensor that operates, actively and wirelessly, to read at least one of the passive location designators; and
        a processor that operates to receive an indication of the particular mounting location from the sensor according to the reading when the rack-mounted appliance is mounted in the equipment rack, and to determine a rack consumption of the rack-mounted appliance according to the indication.

2. The system of claim 1, wherein:
    the rack consumption of a particular rack-mounted appliance corresponds to the mounting location at which the particular rack-mounted appliance is installed.

3. The system of claim 1, wherein:
    the rack consumption of a particular rack-mounted appliance corresponds to the mounting location at which the particular rack-mounted appliance is installed and a number of rack units of space consumed by the particular rack-mounted appliance.

4. The system of claim 1, wherein:
    at least one of the plurality of passive location designators comprises a passive, machine-readable, optical code that corresponds to its respective mounting location, and the sensor is an optical sensor that operates to read the optical code.

5. The system of claim 1, wherein:
    at least one of the plurality of passive location designators comprises a passive, machine-readable, magnetic code that corresponds to its respective mounting location, and
    the sensor is a magnetic sensor that operates to read the magnetic code.

6. The system of claim 1, wherein:
    at least one of the plurality of passive location designators comprises a passive, machine-readable, electrical code that corresponds to its respective mounting location, and
    the sensor comprises an antenna that operates to read the electrical code.

7. The system of claim 1, wherein:
    at least one of the plurality of passive location designators is affixed to the equipment rack at a location corresponding to its respective mounting location.

8. The system of claim 1, wherein:
    at least one of the plurality of passive location designators is integrated into its rail of the equipment rack at a location corresponding to its respective mounting location.

9. The system of claim 1, wherein:
    at least one of the plurality of passive location designators comprises a machine-readable code and a human readable code, both corresponding to its respective mounting location.

10. The system of claim 1, further comprising:
    the plurality of rack-mounted appliances, each installed at a respective mounting location of the equipment rack.

11. A system for self-determination of rack consumption by rack-mounted appliances, the system comprising:
a rack-mounted appliance comprising:
a sensor that operates, actively and wirelessly, when the rack-mounted appliance is installed at a particular one of a plurality of mounting locations of an equipment rack, to read at least one of a plurality of passive location designators to determine the particular mounting location, each passive location designator comprised by the equipment rack and corresponding to a respective one of the mounting locations; and
a processor that operates to receive an indication of the particular mounting location from the sensor and to determine a rack consumption of the rack-mounted appliance according to the indication.

12. The system of claim 11, wherein:
the sensor comprises a plurality of sensor elements disposed in different locations on the rack-mounted, each sensor element operating to read at least one of the passive location designators and to communicate with the processor.

13. The system of claim 11, wherein:
the rack consumption of the rack-mounted appliance corresponds to the mounting location at which the rack-mounted appliance is installed.

14. The system of claim 11, wherein:
the rack consumption of the rack-mounted appliance corresponds to the mounting location at which the rack-mounted appliance is installed and a number of rack units of space consumed by the rack-mounted appliance.

15. The system of claim 11, wherein:
each of the plurality of passive location designators comprises a passive, machine-readable code readable by the sensor without contact between the sensor and the passive location designators.

16. The system of claim 15, wherein:
each code comprises at least one of an optical code, a magnetic code, or an electrical code.

17. The system of claim 15, further comprising:
the equipment rack having a plurality of rails configured to at least partially support the rack mounted device at any of a plurality of mounting locations, each rail comprising at least some of the passive location designators.

18. A method for self-determination of rack consumption by rack-mounted appliances, the system comprising:
reading a code from a particular one of a plurality of passive location designators using an active sensor not in contact with the passive location designator, the particular passive location designator being one of a plurality of passive location designators, each disposed on an equipment rack and each corresponding to a respective one of a plurality of mounting locations of the equipment rack, the sensor being coupled with a rack-mounted appliance installed at a particular one of the mounting locations, and the particular passive location designator corresponding to the particular mounting location; and
determining, by the rack-mounted appliance, a rack consumption of the rack-mounted appliance according to the code.

19. The method of claim 18, further comprising:
determining a physical locator associated with the rack-mounted appliance according to the determined rack consumption of the rack-mounted appliance;
mapping a logical locator associated with the rack-mounted appliance to the physical locator; and
storing the mapping for use by a host computational system.

20. The method of claim 18, further comprising:
determining whether the rack-mounted appliance is properly installed in the equipment rack according to its determined rack consumption.

21. The method of claim 18, wherein:
the rack consumption of the rack-mounted appliance corresponds to at least one of: the mounting location at which the rack-mounted appliance is installed; or a number of rack units of space consumed by the rack-mounted appliance.

22. The method of claim 18, wherein:
each of the plurality of passive location designators comprises a passive, machine-readable code readable by the sensor without contact between the sensor and the passive location designators.

* * * * *